(12) United States Patent
Han

(10) Patent No.: US 10,448,522 B2
(45) Date of Patent: Oct. 15, 2019

(54) FOLDABLE DISPLAY DEVICE

(71) Applicant: Samsung Display Co., Ltd., Yongin-si, Gyeonggi-do (KR)

(72) Inventor: Jiwon Han, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/694,020

(22) Filed: Sep. 1, 2017

(65) Prior Publication Data

US 2018/0070460 A1    Mar. 8, 2018

(30) Foreign Application Priority Data

Sep. 2, 2016 (KR) .................. 10-2016-0113179

(51) Int. Cl.
| | | |
|---|---|---|
| H05K 5/00 | (2006.01) | |
| H05K 1/02 | (2006.01) | |
| G06F 1/16 | (2006.01) | |
| H01L 27/32 | (2006.01) | |
| H01L 51/00 | (2006.01) | |
| H01L 51/52 | (2006.01) | |

(52) U.S. Cl.
CPC ......... *H05K 5/0017* (2013.01); *G06F 1/1626* (2013.01); *G06F 1/1641* (2013.01); *G06F 1/1652* (2013.01); *H05K 1/028* (2013.01); *H01L 27/323* (2013.01); *H01L 27/3246* (2013.01); *H01L 27/3258* (2013.01); *H01L 27/3262* (2013.01); *H01L 27/3265* (2013.01); *H01L 27/3276* (2013.01); *H01L 51/0097* (2013.01); *H01L 51/5256* (2013.01); *H01L 2251/5338* (2013.01)

(58) Field of Classification Search
CPC .... H05K 5/0017; H05K 1/028; H01L 27/323; H01L 27/3246; H01L 27/3258; H01L 27/3262; H01L 27/3265; H01L 27/3276; H01L 51/0097; H01L 51/5256; H01L 2251/5338; G06F 1/1641; G06F 1/1652
See application file for complete search history.

(56) References Cited

U.S. PATENT DOCUMENTS

| | | | |
|---|---|---|---|
| 9,013,458 B2 | 4/2015 | Cho et al. | |
| 9,176,535 B2 | 11/2015 | Bohn et al. | |
| 9,958,976 B2 * | 5/2018 | Endo | G06F 3/0412 |
| 2002/0133992 A1 * | 9/2002 | Wu | G09F 7/04 |
| | | | 40/661.01 |
| 2014/0321073 A1 * | 10/2014 | Hong | G06F 1/1652 |
| | | | 361/749 |

(Continued)

FOREIGN PATENT DOCUMENTS

| | | |
|---|---|---|
| KR | 10-2014-0001376 A | 1/2014 |
| KR | 10-2014-0026547 A | 3/2014 |
| KR | 10-2014-0091273 A | 7/2014 |

(Continued)

*Primary Examiner* — Nathanael R Briggs
(74) *Attorney, Agent, or Firm* — Lewis Roca Rothgerber Christie LLP

(57) ABSTRACT

A foldable display device includes: a display panel including a folding portion that is foldable about a folding line; a metal plate on the display panel, the metal plate having substantially the same shape on a plane as the display panel; a jig supporting the display panel and the metal plate; and a magnetic member between the metal plate and the jig.

14 Claims, 6 Drawing Sheets

(56) References Cited

U.S. PATENT DOCUMENTS

2014/0355195 A1* 12/2014 Kee .................. G06F 1/1616
                                                    361/679.27
2015/0123860 A1*  5/2015 Park ................. H01Q 1/526
                                                       343/720

FOREIGN PATENT DOCUMENTS

| KR | 10-2014-0115913 A | 10/2014 |
| KR | 10-2015-0096827 A | 8/2015 |
| KR | 10-2015-0138450 A | 12/2015 |

* cited by examiner

[FIG 1]
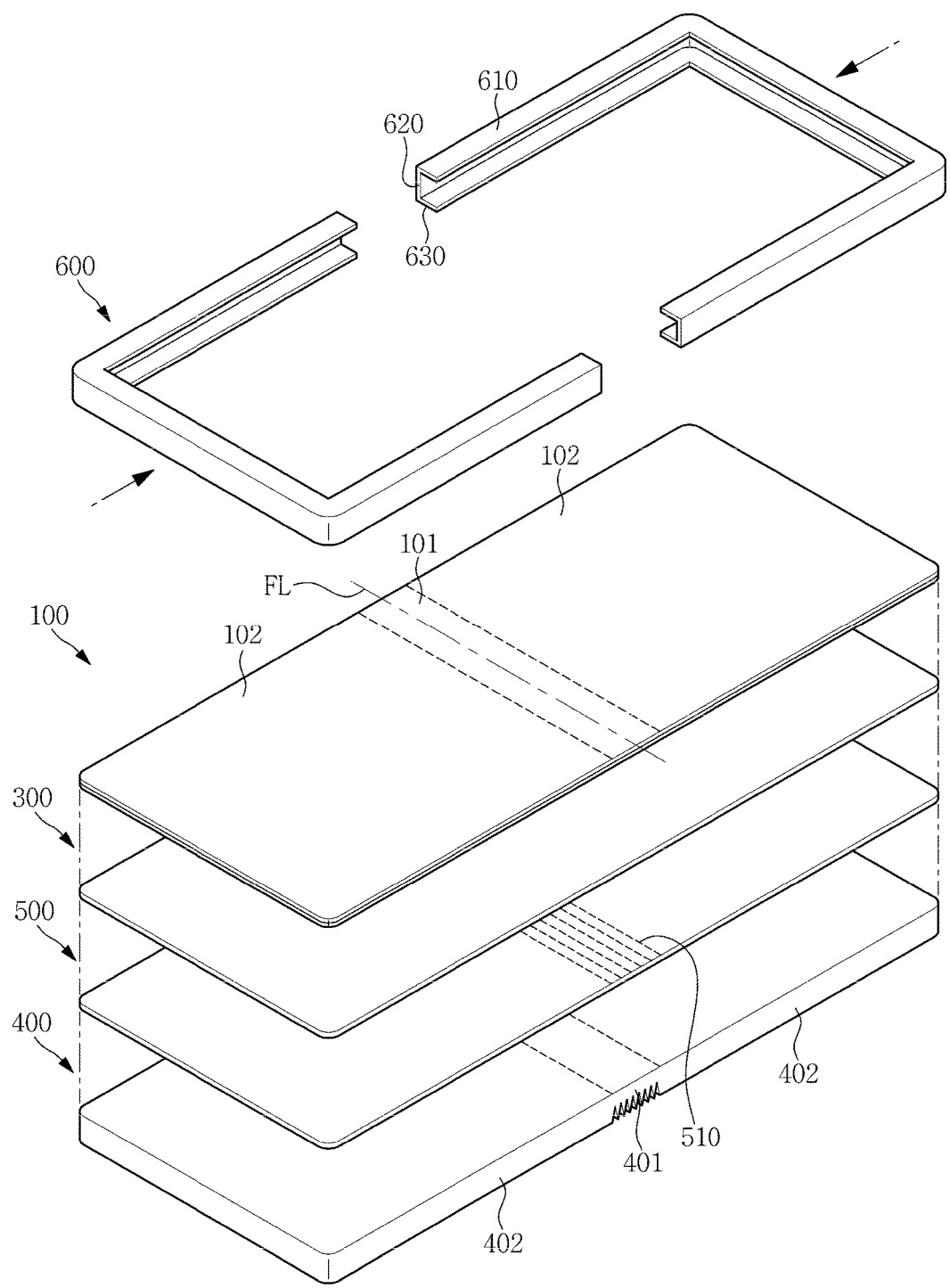

[FIG 2]
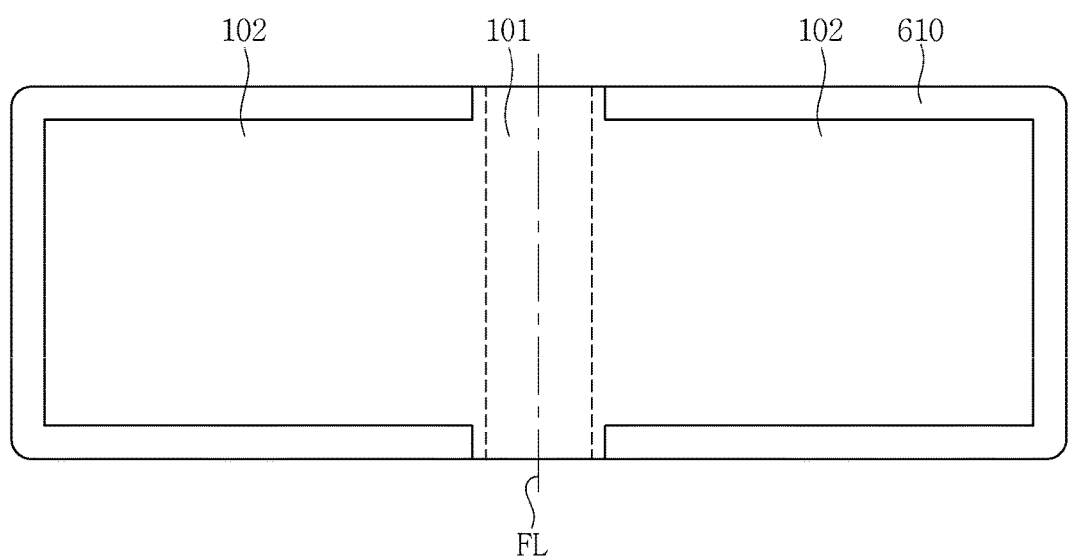

[FIG 3]
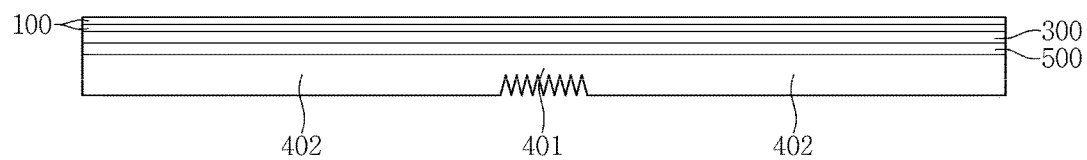

[FIG 4]
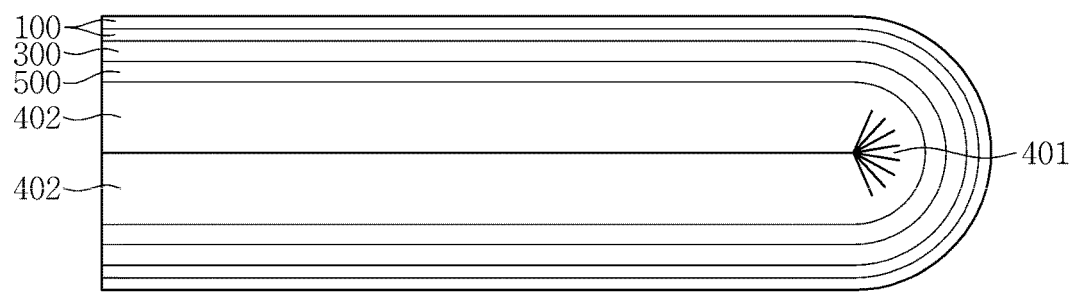

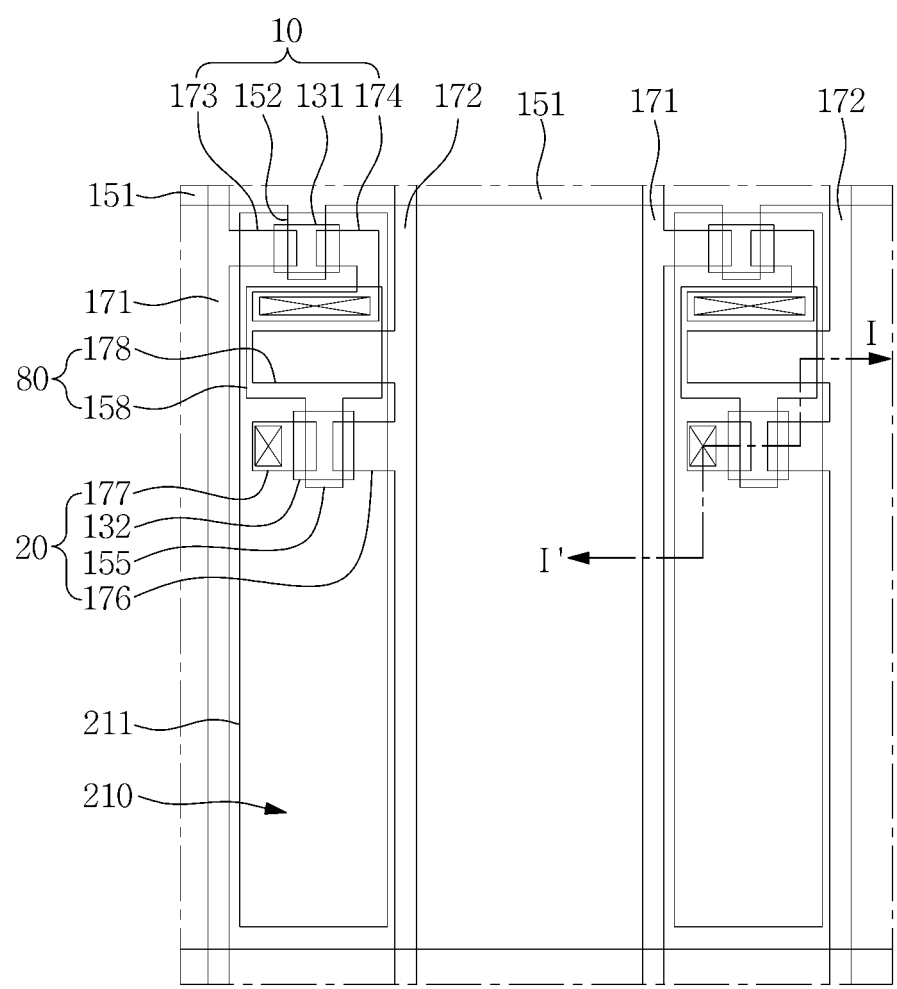
[FIG 5]

[FIG 6]
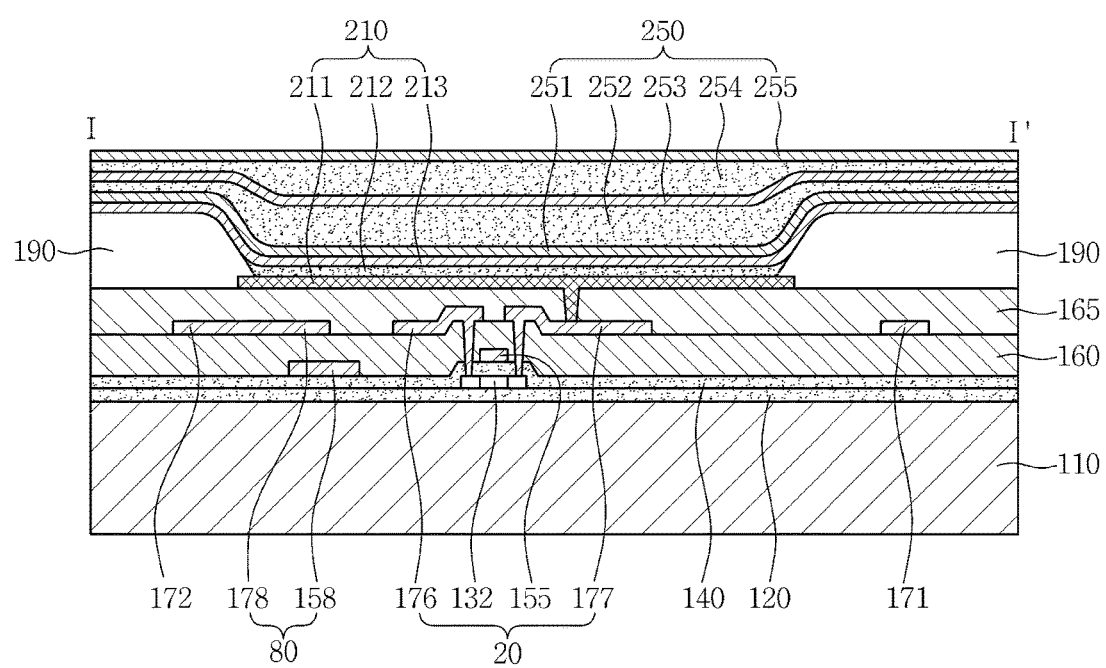

FOLDABLE DISPLAY DEVICE

CROSS-REFERENCE TO RELATED APPLICATION

This application claims priority to and the benefit of Korean Patent Application No. 10-2016-0113179, filed on Sep. 2, 2016 in the Korean Intellectual Property Office (KIPO), the disclosure of which is incorporated by reference herein in its entirety.

BACKGROUND

1. Field

Exemplary embodiments of the present invention relate to a foldable display device.

2. Discussion of Related Art

Recently, flexible display devices that may be bent are being developed. Such a flexible display device may be used in various fields because it may be used in a folded or bent shape. In the flexible display device, a display element is disposed on a flexible substrate.

Examples of the display elements applicable to the flexible display devices may include organic light emitting diode ("OLED") elements, liquid crystal display ("LCD") elements, and electrophoretic display ("EPD") elements. Among these, OLEDs may be manufactured in a thin film-shaped stack structure, thus having excellent flexibility, and are garnering attention as display elements of flexible display devices.

Flexible display devices may be classified into rollable display devices that may be rolled as a scroll, foldable display devices that may be folded as paper, and stretchable display devices that may be scaled up and down.

Among the above-described display devices, the foldable display device has drawn attention as a next-generation display technology because it is easy to carry when the screen is folded, and a large-size display screen may be realized when the screen is unfolded.

The foldable display device may include a flexible display panel and a jig supporting the flexible display panel. As the folding action is repeated, a folding portion of the flexible display panel may be deformed, causing a problem whereby the flexible display panel is detached from the jig.

It is to be understood that this background section is intended to provide useful background for understanding the technology and, as such, this background section may include ideas, concepts, and/or recognitions that were not part of what was known or appreciated by those skilled in the pertinent art prior to a corresponding effective filing date of the subject matter disclosed herein.

SUMMARY

Exemplary embodiments of the present invention may be directed to a foldable display device capable of substantially preventing detachment of a flexible display panel.

According to an exemplary embodiment, a foldable display device includes: a display panel including a folding portion that is foldable about a folding line; a metal plate on the display panel, the metal plate having substantially the same shape on a plane as the display panel; a jig supporting the display panel and the metal plate; and a magnetic member between the metal plate and the jig.

The magnetic member may have substantially the same shape on a plane as the display panel.

The magnetic member may have substantially the same shape on a plane as the folding portion.

The metal plate may include a nickel-iron alloy, such as Invar®, a cast-nickel alloy, such as Nobinite, stainless steel, or alloys thereof.

The magnetic member may be a permanent magnet or an electromagnet.

The foldable display device may further include an adhesive member between the display panel and the metal plate.

The foldable display device may further include an adhesive member between the magnetic member and the jig.

The display panel may further include planar portions at opposite ends of the folding portion.

The jig may include a first jig configured to support the folding portion and second jigs supporting the planar portions.

The first jig may include an uneven portion.

The jig may include second jigs supporting the planar portions, and the second jigs may be physically separated from each other.

The magnetic member may have a groove parallel to the folding line.

The foldable display device may further include a guide ring fastening the display panel to the jig.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the present invention will become apparent by describing, in detail, exemplary embodiments thereof with reference to the accompanying drawings, wherein:

FIG. 1 is an exploded perspective view illustrating a foldable display device according to an exemplary embodiment;

FIG. 2 is a plan view illustrating a state in which a foldable display device according to an exemplary embodiment is unfolded;

FIG. 3 is a cross-sectional view illustrating a state in which a foldable display device according to an exemplary embodiment is unfolded;

FIG. 4 is a cross-sectional view illustrating a state in which a foldable display device according to an exemplary embodiment is folded;

FIG. 5 is an enlarged view illustrating a part of a display panel according to an exemplary embodiment; and FIG. 6 is a cross-sectional view taken along the line I-I' of FIG. 5.

DETAILED DESCRIPTION

Exemplary embodiments will now be described more fully hereinafter with reference to the accompanying drawings. Although the present invention may be modified in various manners and be embodied in many different forms, exemplary embodiments are illustrated in the accompanying drawings and will be primarily described in the specification. However, the scope of the present invention is not limited to the exemplary embodiments described herein and should be construed as including all the changes, equivalents, and substitutions included in the spirit and scope of the present invention.

In the drawings, thicknesses of layers and/or areas may be illustrated in an enlarged manner for clarity and ease of description thereof. When a layer, area, or plate is referred to as being "on" another layer, area, or plate, it may be directly on the other layer, area, or plate or intervening layers, areas, or plates may be present therebetween. When a layer, area, or plate is referred to as being "directly on" another layer, area, or plate, intervening layers, areas, or plates are not present therebetween. Further, when a layer, area, or plate is referred to as being "below" another layer, area, or plate, it may be directly below the other layer, area, or plate or intervening layers, areas, or plates may be present therebetween. When a layer, area, or plate is referred to as being "directly below" another layer, area, or plate, intervening layers, areas, or plates may be absent therebetween.

The spatially relative terms, such as "below", "beneath", "less", "above", "upper", and the like, may be used herein for ease of description to describe the relations between one element or component and another element or component as illustrated in the drawings. It will be understood that such spatially relative terms are intended to encompass different orientations of the device in use or operation, in addition to the orientation depicted in the drawings. For example, when a device illustrated in the drawing is turned over, a device positioned "below" or "beneath" another device would then be "above" the other device. Accordingly, the illustrative term "below" may include both the lower and upper positions. The device may also be oriented in other directions, and, the spatially relative terms may be interpreted differently depending on the orientation.

Throughout the specification, when an element is referred to as being "connected" to another element, the element may be "directly connected" to the other element without intervening elements or "electrically connected" to the other element with one or more intervening elements interposed therebetween. It will be further understood that the terms "comprises," "comprising," "includes," and/or "including," when used in this specification, specify the presence of the stated features, integers, steps, operations, elements, and/or components but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are used to distinguish one element from another element. Thus, "a first element" discussed below could be termed "a second element" or "a third element," and "a second element" and "a third element" may be termed likewise without departing from the teachings herein.

As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the singular forms "a" and "an" are intended to include the plural forms as well, unless the context clearly indicates otherwise.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Some aspects of the exemplary embodiments which are not directly associated with the description or would be understood by those skilled in the art may be omitted in order to concisely describe exemplary embodiments of the present invention. Like reference numerals refer to like elements throughout the specification.

FIG. 1 is an exploded perspective view illustrating a foldable display device according to an exemplary embodiment, FIG. 2 is a plan view illustrating a state in which a foldable display device according to an exemplary embodiment is unfolded, FIG. 3 is a cross-sectional view illustrating a state in which a foldable display device according to an exemplary embodiment is unfolded, and FIG. 4 is a cross-sectional view illustrating a state in which a foldable display device according to an exemplary embodiment is folded.

Referring to FIGS. 1-4, a foldable display device, according to an exemplary embodiment, includes a display panel 100, a metal plate 300 on the display panel 100, a jig 400 supporting the display panel 100 and the metal plate 300, and a magnetic member 500 (e.g., a magnetic plate) between the metal plate 300 and the jig 400.

The display panel 100, according to an exemplary embodiment, may be a flexible display panel. For example, the display panel 100, according to an exemplary embodiment, may be a foldable display panel that may be folded about a folding line FL.

The display panel 100, according to an exemplary embodiment, may include a folding portion 101 that may be folded about the folding line FL and planar portions 102 on opposite sides of the folding portion 101. In the drawings, the display panel 100 is depicted as being folded in bilateral symmetry about the folding line FL (e.g., the folding line FL is at a center portion of the display panel 100). However, exemplary embodiments are not limited thereto, and the display panel 100 may be folded in bilateral asymmetry (e.g., the folding line FL may be offset from the center portion of the display panel 100).

Although described as being separate or divided for ease of description, the folding portion 101 and the planar portions 102 of the display panel 100 may be (or may form) substantially one display area (e.g., may form a single, continuous display area). A plurality of pixels may be disposed in each of the folding portion 101 and the planar portions 102 of the display panel 100 to display an image.

In addition, the display panel 100, according to an exemplary embodiment, is described as folding outwardly with respect to an area on which an image is displayed (e.g., with respect to a display surface), but exemplary embodiments are not limited thereto. In another embodiment, the display panel 100 may be folded inwardly with respect to the area on which an image is displayed.

The display panel 100 may include, for example, a flexible film, such as a plastic film, and may be implemented by disposing an OLED and a pixel circuit on a flexible film. A more detailed configuration of the display panel 100 will be described below.

A cover glass may be disposed on the display panel 100. The cover glass includes a transparent, hard material and may protect the display panel 100 from external impact while allowing the image of the display panel 100 to be viewed therethrough.

A touch sensor may be disposed between the display panel 100 and the cover glass to sense a user's touch action. The touch sensor may be implemented on a separate substrate disposed on the display panel 100 or may be implemented directly inside (or integral with) the display panel 100.

The metal plate 300 may be disposed below the display panel 100. The metal plate 300 may have a substantially same shape on a plane as a shape of the display panel 100 and may be arranged so as to substantially overlap the display panel 100. However, exemplary embodiments are not limited thereto, and the metal plate 300 may have a substantially same shape on a plane as a shape of the folding portion 101 of the display panel 100 and may be disposed so as to substantially overlap the folding portion 101 (e.g., to substantially overlap only the folding portion 101) of the display panel 100.

The metal plate 300 may include a nickel-iron alloy, such as Invar® (a registered trademark of Aperam Alloys Imphy Joint Stock Company), a cast-nickel alloy, such as Nobinte, stainless steel, or alloys thereof.

The display panel 100 and the metal plate 300 may be fixed to each other by an adhesive member interposed therebetween. Any suitable commonly used adhesive may be used. The adhesive member may be, for example, a transparent pressure sensitive adhesive (PSA).

The display panel 100, the cover glass, the touch sensor, the metal plate 300, and the like may constitute a display module laminated panel.

The display panel 100 and the metal plate 300 may be supported by the jig 400. The jig 400 may include a first jig 401 supporting the folding portion 101 of the display panel 100 and second jigs 402 supporting the planar portions 102.

The first jig 401 and the second jigs 402 may be rotatably connected by a hinge. When the foldable display device is unfolded, each of the second jigs 402 may be pivoted about the first jig 401 to support the planar portions 102 of the display panel 100. Similarly, when the foldable display device is folded, the second jigs 402 are pivoted about the first jig 401 to face each other.

The first jig 401, according to an exemplary embodiment, is depicted as including an uneven portion, but exemplary embodiments are not limited thereto. In another exemplary embodiment, the first jig 401 may be omitted, and the second jigs 402 may be physically separated from each other.

The magnetic member 500 may be disposed between the metal plate 300 and the jig 400. The magnetic member 500, according to an exemplary embodiment, may have a substantially same shape on a plane as a shape of the display panel 100, but exemplary embodiments are not limited thereto. In another exemplary embodiment, the magnetic member 500 may have a substantially same shape on a plane as a shape the folding portion 101 of the display panel 100 and may be disposed so as to substantially overlap the folding portion 101 (e.g., to substantially overlap only the folding portion 101) of the display panel 100.

The magnetic member 500 may be, for example, a permanent magnet or an electromagnet. In an embodiment in which the magnetic member 500 is an electromagnet, the foldable display device may further include an electromagnet controller (e.g., a control unit) for supplying a driving current to the magnetic member 500.

The magnetic member 500 and the jig 400 may be fixed to each other by an adhesive member interposed therebetween. Any suitable commonly used adhesive may be used. The adhesive member may be, for example, a transparent pressure sensitive adhesive (PSA).

The magnetic member 500 may fix the display module laminated panel, including the display panel 100 and the like, to the jig 400 by using a magnetic force.

In addition, as the display panel 100 is repeatedly folded and unfolded, the folding portion 101 of the display panel 100 may be deformed and become detached from the jig 400. In such a case, the magnetic member 500 pulls the metal plate 300, attached to the folding portion 101 of the display panel 100, toward the jig 400 such that the detachment phenomenon of the display panel 100 from the jig 400 may be substantially prevented. For example, the magnetic member 500 may provide a magnetic force to the folding portion 101 of the display panel 100 to allow the display panel 100 to closely contact the jig 400.

The magnetic member 500 may have a groove 510 defined in a surface thereof and extending parallel with the folding line FL. For example, the magnetic member 500 may have the groove 510 in an area overlapping, on a plane, the folding portion 101 of the display panel 100. The groove 501 may allow the folding action of the foldable display device to be smoothly performed.

The display panel 100 and the like may be fixed to the jig 400 by the magnetic member 500. However, when the display panel 100 has a relatively great restoring force, a guide ring 600 for fastening the display panel 100 to the jig 400 may be further provided.

The guide ring 600 may include a first bezel portion 610 on an upper edge of the display panel 100, a side surface portion 620 bent in a thickness direction of the display panel 100 from the first bezel portion 610, and a second bezel portion 630 bent from the side surface portion 620 to be disposed on an edge of the jig 400.

The guide ring 600 may be slidably engaged from a side surface of the display panel 100 (e.g., the guide ring 600 may be formed in two separate pieces that may be slidably engaged onto the display panel 100 from opposite ends thereof). Further, the guide ring 600 may be disposed only on the planar portions 102 of the display panel 100 and may be omitted from (e.g., may not cover) the folding portion 101.

FIG. 5 is an enlarged view illustrating a part of a display panel according to an exemplary embodiment, and FIG. 6 is a cross-sectional view taken along the line I-I' of FIG. 5.

Referring to FIGS. 5 and 6, the display panel 100, according to an exemplary embodiment, includes a plurality of pixels, each of the pixels including a switching thin film transistor (TFT) 10, a driving TFT 20, a capacitor 80, and an OLED 210. The OLED 210 may be suitable to be applied to a flexible display device in that the OLED 210 may be deposited at a relatively low temperature and have relatively low power consumption, high luminosity, and the like. As used herein, the term "pixel" refers to a smallest unit for displaying an image, and the display panel 100 displays an image using the plurality of pixels.

Further, although each of the pixels is depicted in the drawings as including two TFTs and one capacitor, exemplary embodiments are not limited thereto. In other embodiments, each of the pixels may include three or more TFTs and two or more capacitors and may further include additional wirings connected to various structures.

The display panel 100 includes a substrate 110, a gate line 151 on the substrate 110, a data line 171, and a common power line 172 insulated from and intersecting the gate line 151. In general, each of the pixels may be defined by the gate line 151, the data line 171, and the common power line 172 as a boundary, but exemplary embodiments are not limited thereto. The pixels may be defined by a pixel defining layer or a black matrix.

The substrate 110 may include (or may be formed of) a flexible material. An example of the flexible material may include a plastic material. For example, the substrate 110 may include a polyimide (PI), such as Kapton® (a registered trademark of E. I. du Pont de Nemours and Company), polyethersulfone (PES), polycarbonate (PC), polyethylene terephthalate (PET), polyethylene naphthalate (PEN), polyacrylate (PAR), fiber reinforced plastic (FRP), and/or the like.

In addition, the substrate 110 may have a thickness in a range from about 5 μm to about 200 μm. When the substrate 110 has a thickness of less than about 5 μm, it is difficult for the substrate 110 to stably support the OLED 210. When the substrate 110 has a thickness of about 200 μm or more, the flexible characteristics of the substrate 110 may be degraded.

A buffer layer 120 is disposed on the substrate 110. The buffer layer 120 is configured to prevent or reduce permeation of undesirable elements and to planarize a surface therebelow and may include suitable materials for preventing or reducing permeation and/or for planarizing. For example, the buffer layer 120 may include a silicon nitride ($SiN_x$) layer, a silicon oxide ($SiO_2$) layer, and/or a silicon oxynitride ($SiO_xN_y$) layer. However, the buffer layer 120 may be omitted based on the kinds of the substrate 110 (e.g., based on the material of the substrate 110) and process conditions thereof.

A switching semiconductor layer 131 and a driving semiconductor layer 132 are disposed on the buffer layer 120. The switching semiconductor layer 131 and the driving semiconductor layer 132 may include a polycrystalline silicon layer, an amorphous silicon layer, and/or an oxide semiconductor including, for example, indium gallium zinc oxide (IGZO) and/or indium zinc tin oxide (IZTO). For example, when the driving semiconductor layer 132 includes the polycrystalline silicon layer, the driving semiconductor layer 132 includes a channel area that is not doped with impurities and p+ doped source and drain areas that are formed on opposite sides of the channel area. In such an exemplary embodiment, p-type impurities, such as boron, may be used as dopant ions and diborane ($B_2H_6$) is often used. Such impurities may vary depending on the kinds of TFTs. The driving TFT 20, according to an exemplary embodiment, is a p-channel metal oxide semiconductor (PMOS) TFT including p-type impurities, but exemplary embodiments are not limited thereto. In another exemplary embodiment, the driving TFT 20 may be an n-channel metal oxide semiconductor (NMOS) TFT or a complementary metal oxide semiconductor (CMOS) TFT.

A gate insulating layer 140 is disposed on the switching semiconductor layer 131 and the driving semiconductor layer 132. The gate insulating layer 140 may include tetraethyl orthosilicate (TEOS), silicon nitride ($SiN_x$), and/or silicon oxide ($SiO_2$). For example, the gate insulating layer 140 may have a double-layer structure in which a silicon nitride ($SiN_x$) layer having a thickness of about 40 nm and a TEOS layer having a thickness of about 80 nm are sequentially stacked.

A gate wiring including gate electrodes 152 and 155 is disposed on the gate insulating layer 140. The gate wiring further includes the gate line 151, a first capacitor plate 158, and other lines. In addition, the gate electrodes 152 and 155 are disposed to overlap at least a portion of the semiconductor layers 131 and 132, for example, a channel area thereof. The gate electrodes 152 and 155 serve to substantially prevent the channel area from being doped with impurities when source and drain areas of the semiconductor layers 131 and 132 are doped with impurities during the process of forming the semiconductor layers 131 and 132.

The gate electrodes 152 and 155 and the first capacitor plate 158 are disposed on the same or substantially similar layer and include the same or substantially similar metal material. The gate electrodes 152 and 155 and the first capacitor plate 158 may include molybdenum (Mo), chromium (Cr), and/or tungsten (W).

An insulating interlayer 160 overlapping the gate electrodes 152 and 155 is disposed on the gate insulating layer 140. The insulating interlayer 160, similar to the gate insulating layer 140, may include or may be formed of silicon nitride ($SiN_x$), silicon oxide ($SiO_x$), tetraethyl orthosilicate (TEOS), or the like, but exemplary embodiments are not limited thereto.

A data wiring including source electrodes 173 and 176 and drain electrodes 174 and 177 is disposed on the insulating interlayer 160. The data wiring further includes the data line 171, the common power line 172, a second capacitor plate 178, and other lines. In addition, the source electrodes 173 and 176 and the drain electrodes 174 and 177 are connected to a source area and a drain area of the semiconductor layers 131 and 132, respectively, through a contact opening (e.g., a contact hole) defined in the gate insulating layer 140 and the insulating interlayer 160.

As such, the switching TFT 10 includes the switching semiconductor layer 131, the switching gate electrode 152, the switching source electrode 173, and the switching drain electrode 174, and the driving TFT 20 includes the driving semiconductor layer 132, the driving gate electrode 155, the driving source electrode 176, and the driving drain electrode 177. Configurations of the TFTs 10 and 20 are not limited to the above embodiments and may be modified into various suitable structures that are known to and may be easily conceived by those skilled in the pertinent art.

In addition, the capacitor 80 includes the first capacitor plate 158 and the second capacitor plate 178 with the insulating interlayer 160 interposed therebetween.

The switching TFT 10 may function as a switching element configured to select pixels to perform light emission. The switching gate electrode 152 is connected to the gate line 151. The switching source electrode 173 is connected to the data line 171. The switching drain electrode 174 is spaced from (e.g., spaced apart from) the switching source electrode 173 and is connected to the first capacitor plate 158.

The driving TFT 20 applies driving power to a pixel electrode 211, which allows a light emitting layer 212 of the OLED 210 in the selected pixel to emit light. The driving gate electrode 155 is connected to the first capacitor plate 158. The driving source electrode 176 and the second capacitor plate 178 are each connected to the common power line 172. The driving drain electrode 177 is connected to the pixel electrode 211 of the OLED 210 through a contact opening.

With the aforementioned structure, the switching TFT 10 is driven by a gate voltage applied to the gate line 151 and transmits data voltage applied to the data line 171 to the driving TFT 20. A voltage equivalent to a difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED 210 through the driving TFT 20, such that the OLED 210 may emit light.

A planarization layer 165 is disposed to cover the data wiring (e.g., the data line 171, the common power line 172, the source electrodes 173 and 176, the drain electrodes 174 and 177, and the second capacitor plate 178, which are patterned into a substantially same layer on the insulating interlayer 160).

The planarization layer 165 substantially eliminates a step difference and planarize a surface so as to increase luminance efficiency of the OLED 210 formed thereon. The planarization layer 165 may include a polyacrylate resin, an epoxy resin, a phenolic resin, a polyamide resin, a polyimide resin, an unsaturated polyester resin, a polyphenylene ether resin, a polyphenylene sulfide resin, and/or benzocyclobutene (BCB).

The pixel electrode 211 of the OLED 210 is disposed on the planarization layer 165. The pixel electrode 211 is connected to the drain electrode 177 through a contact opening defined in the planarization layer 165.

A pixel defining layer 190 exposing at least a portion of the pixel electrode 211 to define a pixel area is disposed on the planarization layer 165. The pixel electrode 211 is disposed corresponding to the pixel area of the pixel defining layer 190. The pixel defining layer 190 may include a resin, such as a polyacrylate resin and/or a polyimide resin.

In the pixel area, the light emitting layer 212 is disposed on the pixel electrode 211 and a common electrode 213 is disposed on the pixel defining layer 190 and the light emitting layer 212. The light emitting layer 212 includes a low molecular weight organic material or a high molecular weight organic material. A hole injection layer HIL and/or a hole transporting layer HTL may also be disposed between the pixel electrode 211 and the light emitting layer 212, and an electron transporting layer ETL and/or an electron injection layer EIL may be further disposed between the light emitting layer 212 and the common electrode 213.

The pixel electrode 211 and the common electrode 213 may be formed as a transmissive electrode, a transflective electrode, or a reflective electrode.

A transparent conductive oxide (TCO) may be used to form a transmissive electrode. The TCO may include indium tin oxide (ITO), indium zinc oxide (IZO), zinc oxide (ZnO), and/or indium oxide ($In_2O_3$)

A metal, such as magnesium (Mg), silver (Ag), gold (Au), calcium (Ca), lithium (Li), chromium (Cr), aluminum (Al), and copper (Cu), or an alloy thereof, may be used to form a transflective electrode and a reflective electrode. In such an exemplary embodiment, whether an electrode is a transflective type or a reflective type depends on the thickness of the electrode. The transflective electrode may have a thickness of about 200 nm or less, and the reflective electrode may have a thickness of about 300 nm or more. As the thickness of the transflective electrode decreases, light transmittance and resistance increase. As the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

A thin film encapsulation layer 250 is disposed on the common electrode 213. The thin film encapsulation layer 250 includes inorganic layers 251, 253, and 255 and organic layers 252 and 254. Further, the thin film encapsulation layer 250 may have a structure in which the inorganic layers 251, 253, and 255 and the organic layers 252 and 254 are alternately stacked. In such an exemplary embodiment, the inorganic layer 251 is disposed at a lowermost portion or position. For example, the inorganic layer 251 is disposed most adjacent to (e.g., nearest to or directly on) the OLED 210.

The thin film encapsulation layer 250 is depicted as including three inorganic layers 251, 253, and 255 and two organic layers 252 and 254, but exemplary embodiments are not limited thereto.

The inorganic layers 251, 253, and 255 may include one or more inorganic materials including $Al_2O_3$, $TiO_2$, $ZrO$, $SiN_x$, $SiO_2$, AlON, AlN, SiON, $Si_3N_4$, ZnO, and/or $Ta_2O_5$. The inorganic layers 251, 253, and 255 may be formed through methods, such as a chemical vapor deposition (CVD) method or an atomic layer deposition (ALD) method. However, exemplary embodiments are not limited thereto, and the inorganic layers 251, 253, and 255 may be formed using various methods known to those skilled in the art.

The organic layers 252 and 254 may include a polymer-based material. Examples of the polymer-based material may include, for example, an acrylic resin, an epoxy resin, polyimide, and polyethylene. In addition, the organic layers 252 and 254 may be formed through a thermal deposition process. In addition, the thermal deposition process for forming the organic layers 252 and 254 may be performed in a temperature range that may not damage the OLED 210. However, exemplary embodiments are not limited thereto, and the organic layers 252 and 254 may be formed using various methods known to those skilled in the pertinent art.

The inorganic layers 251, 253, and 255, which have a relatively high density, may prevent or efficiently reduce permeation of, primarily, moisture and oxygen. Permeation of moisture and oxygen into the OLED 210 may be largely prevented by the inorganic layers 251, 253, and 255.

The thin film encapsulation layer 250 may have a thickness of about 10 μm or less. Accordingly, an overall thickness of the OLED display panel 100 may be small. By applying the thin film encapsulation layer 250 in such a manner, flexible characteristics of the OLED display panel 100 may be improved.

As set forth hereinabove, detachment of the flexible display panel may be substantially prevented by disposing a magnetic element between the flexible display panel and the jig.

While the present invention has been illustrated and described with reference to exemplary embodiments thereof, it will be apparent to those of ordinary skill in the art that various changes in form and detail may be made thereto without departing from the spirit and scope of the present invention.

What is claimed is:

1. A foldable display device comprising:
a display panel comprising a folding portion that is foldable between an unfolded state and a folded state about a folding line;
a metal plate on the display panel, the metal plate having substantially the same shape on a plane as the display panel;
a jig supporting the display panel and the metal plate; and
a magnetic member to fix the display panel to the jig using a magnetic force of the magnetic member acting on the metal plate,
wherein, in the unfolded state, the metal plate and the magnetic member are between the folding portion and the jig.

2. The foldable display device as claimed in claim 1, wherein the magnetic member has substantially the same shape on a plane as the display panel.

3. The foldable display device as claimed in claim 1, wherein the magnetic member has substantially the same shape on a plane as the folding portion.

4. The foldable display device as claimed in claim 1, wherein the metal plate comprises a nickel-iron alloy, a cast-nickel alloy, stainless steel, or alloys thereof.

5. The foldable display device as claimed in claim 1, wherein the magnetic member is a permanent magnet or an electromagnet.

6. The foldable display device as claimed in claim 1, further comprising an adhesive member between the display panel and the metal plate.

7. The foldable display device as claimed in claim 1, further comprising an adhesive member between the magnetic member and the jig.

8. The foldable display device as claimed in claim 1, wherein the display panel further comprises planar portions at opposite ends of the folding portion.

9. The foldable display device as claimed in claim 8, wherein the jig comprises a first jig supporting the folding portion and second jigs supporting the planar portions.

10. The foldable display device as claimed in claim 9, wherein the first jig comprises an uneven portion.

11. The foldable display device as claimed in claim 8, wherein the jig comprises second jigs supporting the planar portions, the second jigs being physically separated from each other.

12. The foldable display device as claimed in claim 1, wherein the magnetic member has a groove parallel to the folding line.

13. The foldable display device as claimed in claim 1, further comprising a guide ring fastening the display panel to the jig.

14. The foldable display device as claimed in claim 9, wherein the first jig directly contacts a side surface of each of the second jigs.

* * * * *